United States Patent
Yamakawa et al.

(10) Patent No.: US 6,761,947 B2
(45) Date of Patent: *Jul. 13, 2004

(54) SILICONE-BASED ADHESIVE SHEET, METHOD FOR MANUFACTURING SAME, AND SEMICONDUCTOR DEVICE

(75) Inventors: Kimio Yamakawa, Chiba Prefecture (JP); Minoru Isshiki, Chiba Prefecture (JP); Yoshiko Otani, Chiba Prefecture (JP); Katsutoshi Mine, Chiba Prefecture (JP)

(73) Assignee: Dow Corning Toray Silicone Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/347,564

(22) Filed: Jan. 17, 2003

(65) Prior Publication Data

US 2003/0129347 A1 Jul. 10, 2003

Related U.S. Application Data

(62) Division of application No. 09/384,152, filed on Aug. 27, 1999, now Pat. No. 6,551,676.

(30) Foreign Application Priority Data

Sep. 4, 1998 (JP) .......................................... 10-250593
Sep. 25, 1998 (JP) .......................................... 10-270754

(51) Int. Cl.$^7$ .............................................. B32B 33/00
(52) U.S. Cl. ................ 428/40.1; 156/272.5; 156/275.5; 156/327; 156/329; 428/41.3; 428/41.4; 428/41.5; 428/41.7; 428/41.8; 428/447; 428/448; 428/480; 428/914
(58) Field of Search .............................. 428/40.1, 41.3, 428/41.4, 41.5, 41.7, 41.8, 447, 448, 480, 914, 355; 156/272.5, 275.5, 327, 329

(56) References Cited

U.S. PATENT DOCUMENTS

6,235,862 B1 * 5/2001 Isshiki .......................... 528/15
6,304,000 B1 * 10/2001 Isshiki .......................... 257/782
6,379,792 B1 * 4/2002 Isshiki et al. ............ 428/355 R

FOREIGN PATENT DOCUMENTS

| JP | 2-64184 | * | 3/1990 |
| JP | 3157474 | | 7/1991 |
| JP | 10112516 | | 4/1998 |

* cited by examiner

*Primary Examiner*—Nasser Ahmad
(74) *Attorney, Agent, or Firm*—Catherine U. Brown

(57) ABSTRACT

A silicone-based adhesive sheet prepared by a process comprising (i) curing a silicone composition to form a substantially cured product while the composition lies between backing materials, wherein at least one of the backing materials has a surface comprising oxygen atoms and/or sulfur atoms in contact with the silicone composition and the backing materials are releasable from the cured product, and (ii) separating the cured product from the backing materials. A method of manufacturing a silicone-based adhesive sheet comprising (i) curing a silicone composition to form a cured product while the composition lies between backing materials, wherein at least one of the backing materials has a surface comprising oxygen atoms and/or sulfur atoms in contact with the silicone composition and the backing materials are releasable from the cured product, and (ii) separating the cured product from the backing materials. A semiconductor device comprising a semiconductor chip, a chip attachment component, and the above-mentioned silicone-based adhesive sheet, wherein the semiconductor chip is bonded to the chip attachment component with the silicone-based adhesive sheet.

17 Claims, 1 Drawing Sheet

SILICONE-BASED ADHESIVE SHEET, METHOD FOR MANUFACTURING SAME, AND SEMICONDUCTOR DEVICE

CROSS REFERENCE

This application is a divisional of U.S. patent application Ser. No. 09/384,152, filed on Aug. 27, 1999, now U.S. Pat. No. 6,551,676. U.S. patent application Ser. No. 09/384,152 claims priority to JP 10/250,593, filed Sep. 4, 1998 and to JP 10/270,754, filed Sep. 25, 1998. This application claims priority to U.S. patent application Ser. No. 09/384,152 under 35 U.S.C. § 120, to JP 10/250,593 under 35 U.S.C. § 119 and to JP 10/270,754 under 35 U.S.C. § 119.

FIELD OF THE INVENTION

The present invention relates to a silicone-based adhesive sheet, a method for manufacturing same, and a semiconductor device. More particularly, this invention relates to a silicone-based adhesive sheet that is easier to handle and provides superior adhesion, to a method for efficiently manufacturing this silicone-based adhesive sheet, and to a semiconductor device with superior reliability, wherein a semiconductor chip is bonded to a chip attachment component by means of this silicone-based adhesive sheet.

BACKGROUND OF THE INVENTION

Silicone-based adhesives have been used to bond semiconductor chips to chip attachment components. Examples of these silicone-based adhesives include curable silicone compositions in the form of a liquid or paste comprising at least of an organopolysiloxane having at least two silicon-bonded alkenyl groups per molecule, an organopolysiloxane having at least two silicon-bonded hydrogen atoms per molecule, and a hydrosilylation reaction catalyst. Another example is a curable silicone composition in the form of a liquid or paste further containing, as an adhesion promoter, an organopolysiloxane having at least one silicon-bonded alkenyl group or silicon atom-bonded hydrogen atom and at least one silicon-bonded alkoxy group per molecule (see Japanese Laid-Open Patent Application 3-157474).

However, a problem with a curable silicone composition in the form of a liquid or paste is that a low-viscosity silicone oil or the like tends to ooze out of the composition during curing and foul the surrounding area. This low-viscosity silicone oil might be an organopolysiloxane with a low degree of polymerization included in the main organopolysiloxane component, or it might be an organopolysiloxane with a low degree of polymerization included in the organopolysiloxane added as an adhesion promoter, which makes it extremely difficult to eliminate these oils completely. Consequently, a drawback to a curable silicone composition in the form of a liquid or paste is that it is difficult to handle.

Another problem is that when a curable silicone composition such as the above is used to bond a semiconductor chip to a chip attachment component, and a bonding wire or beam lead is then bonded to a bonding pad on the chip, there is a decrease in wire bondability, which compromises the reliability of the semiconductor device thus obtained.

In an effort to solve these problems, there has been a proposal for a silicone-based adhesive sheet produced by coating one or both sides of a silicone rubber sheet with a curable silicone composition in the form of a liquid or paste (see Japanese Laid-Open Patent Application 10-112516), but even this does not solve the above problems sufficiently.

SUMMARY OF THE INVENTION

An object of the present invention is to provide a silicone-based adhesive sheet that is easier to handle and affords superior adhesion, a method for efficiently manufacturing this silicone-based adhesive sheet, and a semiconductor device with superior reliability, wherein a semiconductor chip is bonded to a chip attachment component by means of this silicone-based adhesive sheet.

The present invention is directed to a silicone-based adhesive sheet produced by curing a silicone composition between backing materials that do not stick to the cured product of the composition, wherein at least one of the backing materials has oxygen atoms and/or sulfur atoms in contact with the composition.

The present invention is also directed to a method of manufacturing a silicone-based adhesive sheet, the method comprising curing a silicone composition between backing materials that do not stick to the cured product of the composition, wherein at least one of the backing materials has oxygen atoms and/or sulfur atoms in contact with the composition.

The present invention is further directed to a semiconductor device comprising a semiconductor chip, a chip attachment component, and the aforementioned silicone-based adhesive, wherein the semiconductor chip is bonded to the chip attachment component with the silicone-based adhesive sheet.

DETAILED DESCRIPTION OF THE INVENTION

Figure 1:
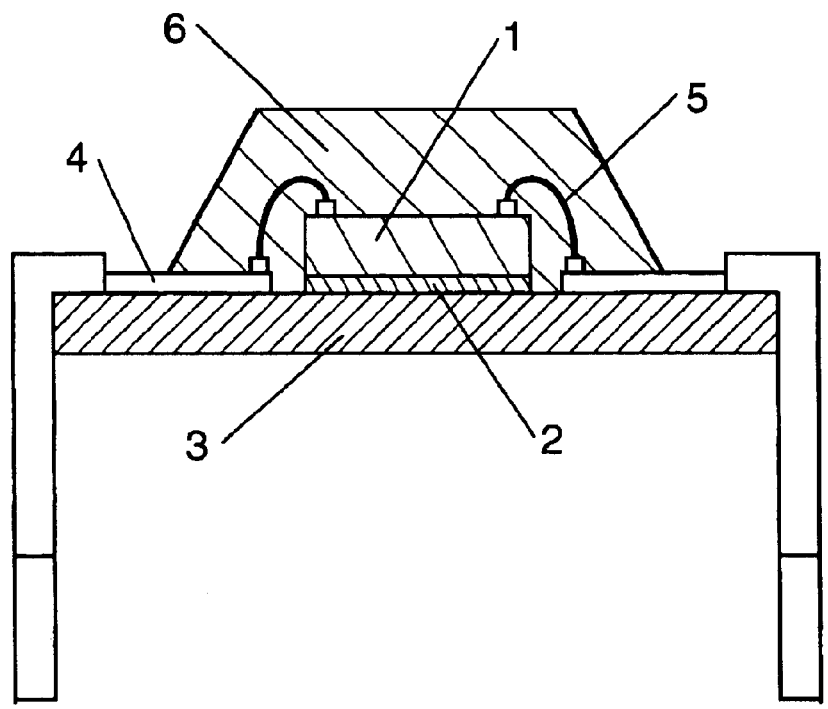
FIG. 1 is a cross section of a hybrid IC, which is an example of the semiconductor device of the present invention.

The silicone-based adhesive sheet of the present invention is a cured (crosslinked) product of a silicone composition. There are no restrictions on the degree of curing of the cured product that forms the adhesive sheet. For example, the silicone composition can be completely cured until there is substantially no more change in the hardness of the cured product or incompletely cured. The term "incompletely cured" refers to an adhesive in the B-stage as defined in JIS K 6800 (Adhesives and Bonding Terminology). The term "B stage" refers to an intermediate in the curing of thermosetting resins. In this stage the resin will soften when heated and will swell when in contact with certain solvents, but will not completely fuse or dissolve.

There are no restrictions on the internal structure of the silicone-based adhesive sheet provided the side in contact with the bonding surface is formed from the crosslinked product of a silicone composition, but it may internally include an organic resin support, such as a silicone rubber sheet, a polyimide resin sheet, a polyester resin sheet, or an epoxy resin sheet, or it may contain an inorganic filler, such as silica particles, glass particles, or alumina particles, or an organic filler, such as silicone rubber particles, polyimide resin particles, polyester resin particles, or epoxy resin particles. There are no restrictions on the shape or thickness of the silicone-based adhesive sheet. However, for practical purposes, the thickness of the adhesive sheet is typically from 1 to 5000 $\mu$m and preferably from 10 to 1000° m.

Typically, the silicone-based adhesive sheet is produced by curing a silicone composition between backing materials to produce a cured product, wherein at least one of the backing materials has a surface comprising oxygen atoms and/or sulfur atoms in contact with the silicone composition and the backing materials are releasable from the cured product. Preferably, the oxygen atoms are contained in organic groups selected from the group consisting of carbonyl groups, alkoxy groups, ester groups, and ether groups. Preferably, the sulfur atoms are contained in groups selected from the group consisting of sulfone groups and thioether groups. The presence of the oxygen atoms and/or sulfur atoms on the surface of a backing material having non-stick properties, and particularly the presence of groups whose constituent atoms include oxygen atoms and/or sulfur atoms, can be easily confirmed by elemental analysis, fluorescent X-ray analysis, X-ray microanalyzer analysis, infrared absorption analysis, ESCA analysis, or the like. There are no restrictions on the amount of these atoms or groups, but the content should be large enough to be detected by the above-mentioned analysis methods. Examples of backing materials that have these atoms or groups and have non-stick properties include, but are not limited to, polyester resins, polyether resins, polyether ether ketone resins, epoxy resins, phenol resins, polyoxymethylene resins, polyamide resins, polyether imide resins, polysulfone resins, polyether sulfone resins, and polyphenylene sulfide resins. Examples of backing materials also include polyethylene resins, polypropylene resins, fluororesins, and the like that do not have these atoms or groups in their structural molecules, but have had introduced into them oxygen atoms and/or sulfur atoms, or groups in which these atoms are constituent atoms, chemically bonded to the surface thereof by a corona treatment, glow treatment, plasma treatment, ozone treatment, ultraviolet treatment, or the like, or by another physical and/or chemical treatment. The backing materials may be composed solely of these organic resins, or they may be composite materials composed of these organic resins. Furthermore, it is preferable for these backing materials to have a high dielectric constant and/or refractive index with respect to the cured product of the silicone composition.

There are no restrictions on the shape of these backing materials, but examples include materials in the form of a block, a sheet, or a film. The use of a film-shaped backing material is particularly favorable because it can be used as a protective material for the silicone-based adhesive sheet. For instance, this protective material can be peeled off when this silicone-based adhesive sheet is to be applied to bonding surfaces such as a semiconductor chip and a chip attachment component. A backing material may also be replaced with another non-stick backing material after the manufacture of the silicone-based adhesive sheet. There are no restrictions on the latter non-stick backing material.

Examples of the curable silicone composition of the present invention include hydrosilylation reaction curable silicone compositions, organic peroxide curable silicone compositions, condensation reaction curable silicone compositions, and ultraviolet curable silicone compositions. Preferably, the silicone composition is a hydrosilylation reaction curable silicone composition. A preferred hydrosilylation curable silicone composition comprises:

(A) an organopolysiloxane having at an average of least two silicon atom-bonded alkenyl groups per molecule;

(B) an organopolysiloxane having an average of at least two silicon atom-bonded hydrogen atoms per molecule;

(C) at least one type of adhesion promoter selected from the group consisting of (i) siloxanes having at least one silicon atom-bonded alkoxy group and at least one silicon-bonded alkenyl group or silicon-bonded hydrogen atom per molecule, (ii) siloxanes having at least one silicon atom-bonded alkenyl group, at least one silicon-bonded alkoxy group, and at least one silicon-bonded epoxy-containing monovalent organic group per molecule, (iii) mixtures or reaction mixtures of silanes or siloxanes having at least one silicon-bonded alkoxy group per molecule with organosiloxanes having at least one silicon-bonded hydroxy group and at least one silicon-bonded alkenyl group per molecule, and (iv) mixtures or reaction mixtures of silanes or siloxanes having at least one silicon-bonded alkoxy group and at least one silicon-bonded epoxy-containing monovalent organic group per molecule with organosiloxanes having at least one silicon-bonded hydroxy group and at least one silicon-bonded alkenyl group per molecule; and (D) a hydrosilylation reaction catalyst.

Component (A) of the present invention is an organopolysiloxane having an average of at least two silicon-bonded alkenyl groups per molecule. Component (A) is the principal ingredient of the silicone composition. The molecular structure of Component (A) can be linear, linear with some branches, branched, or reticulated. Examples of the silicon-bonded alkenyl groups in component (A) include, but are not limited to, vinyl, allyl, butenyl, pentenyl, and hexenyl, with the vinyl group being particularly preferred. These alkenyl groups can be attached to the ends of the molecular chain and/or to internal positions on the molecular chain. Examples of groups that can be bonded to the silicon atoms besides the alkenyl groups in component (A) include, but are not limited to, alkyl such as methyl, ethyl, propyl, butyl, pentyl, hexyl, and heptyl; aryl such as phenyl, tolyl, xylyl, and naphthyl; aralkyl such as benzyl and phenethyl; halogenated alkyl such as chloromethyl, and 3-chloropropyl, 3,3,3-trifluoropropyl; and other substituted or unsubstituted monovalent hydrocarbon groups. Preferred groups are methyl and phenyl. Also, because the silicone-based adhesive sheet thus obtained will have excellent cold resistance, and because a semiconductor device produced using this silicone-based adhesive sheet will have enhanced reliability, it is preferable for the phenyl group content to be at least 1 mol % with respect to the organic groups bonded to the silicon atoms in component (A). More preferably, the phenyl group content of component (A) is from 1 to 60 mol % and most preferably from 1 to 30 mol %. There are no restrictions on the viscosity of component (A), but the viscosity at 25° C. is preferably from 100 to 1,000,000 mPa·s.

Component (B) is an organopolysiloxane having an average of at least two silicon-bonded hydrogen atoms per molecule. The molecular structure of component (B) can be linear, linear with some branches, branched, cyclic, or reticulated. The silicon-bonded hydrogen atoms in component (B) can be bonded to the ends of the molecular chain and/or to internal positions in the molecular chain. Examples of groups that can be bonded to the silicon atoms besides the hydrogen atoms in component (B) include, but are not limited to, alkyl such as methyl, ethyl, propyl, butyl, pentyl, hexyl, and heptyl; aryl such as phenyl, tolyl, xylyl, and naphthyl; aralkyl such as benzyl and phenethyl; halogenated alkyl such as chloromethyl, 3-chloropropyl, and 3,3,3-trifluoropropyl; and other substituted or unsubstituted monovalent hydrocarbon groups. Preferred groups are methyl and phenyl. There are no restrictions on the viscosity of component (B), but the viscosity at 25° C. is preferably from 1 to 100,000 mPa·s.

The concentration of component (B) should be sufficient to crosslink the above-mentioned component A. Preferably, component (B) is present in an amount sufficient to provide from 0.5 to 10 moles of silicon-bonded hydrogen atoms per mole of silicon-bonded alkenyl groups in component A, and more preferably component (B) is present in an amount sufficient to provide from 1 and 3 moles of silicon-bonded hydrogen atoms per mole of silicon-bonded alkenyl groups in component (A). When the number of moles of silicon-bonded hydrogen atoms in component (A) per mole of silicon-bonded alkenyl groups in component (B) is less than 0.5, the silicone composition tends not to be crosslinked. When the number of moles of silicon-bonded hydrogen atoms per alkenyl group is greater than 10, the cured product of the silicone composition tends to have diminished heat resistance.

Component (C) of the present invention is an adhesion promoter that imparts good adhesive properties to the cured product of the silicone composition. Component (C) is typically at least one type of adhesion promoter selected from the group consisting of (i) siloxanes having at least one silicon-bonded alkoxy group and at least one silicon-bonded alkenyl group or silicon-bonded hydrogen atom per molecule, (ii) siloxanes having at least one silicon-bonded alkenyl group, at least one silicon-bonded alkoxy group, and at least one silicon-bonded epoxy-containing monovalent organic group per molecule, (iii) mixtures or reaction mixtures of silanes or siloxanes having at least one silicon-bonded alkoxy group per molecule with organosiloxanes having at least one silicon-bonded hydroxy group and at least one silicon-bonded alkenyl group per molecule, and (iv) mixtures or reaction mixtures of silanes or siloxanes having at least one silicon-bonded alkoxy group and at least one silicon-bonded epoxy-containing monovalent organic group per molecule with organosiloxanes having at least one silicon-bonded hydroxy group and at least one silicon-bonded alkenyl group per molecule.

The molecular structure of the siloxane having at least one silicon-bonded alkoxy group and at least one silicon-bonded alkenyl group or silicon-bonded hydrogen atom per molecule can be linear, linear with some branches, branched, cyclic, or reticulated. Preferably the structure of the siloxane is linear, branched, or reticulated. Examples of the silicon-bonded alkenyl groups in the siloxane include, but are not limited to, vinyl, allyl, butenyl, pentenyl, and hexenyl, with vinyl being particularly preferred. Examples of the silicon atom-bonded alkoxy groups in these siloxanes include, but are not limited to, methoxy, ethoxy, propoxy, butoxy, and methoxyethoxy, with methoxy being particularly preferred. Examples of silicon-bonded organic groups other than alkenyl groups, hydrogen atoms, and alkoxy groups in the siloxane include, but are not limited to, alkyl such as methyl, ethyl, propyl, butyl, pentyl, hexyl, and heptyl; aryl such as phenyl, tolyl, xylyl, and naphthyl; aralkyl such as benzyl and phenethyl; halogenated alkyl such as chloromethyl, 3-chloropropyl, and 3,3,3-trifluoropropyl; other substituted or unsubstituted monovalent hydrocarbon groups; epoxy-containing monovalent organic groups such as 3-glycidoxypropyl, 4-glycidoxypropyl, and other glycidoxyalkyl groups, 2-(3,4-epoxycyclohexyl)ethyl, 3-(3,4-epoxycyclohexyl)propyl, and other (3,4-epoxycyclohexyl)alkyl groups; and oxysilanylalkyl groups such as 4-oxysilanylbutyl and 8-oxysilanyloctyl. Preferably, the siloxane contains at least one epoxy-containing monovalent organic group per molecule because such siloxanes provide good adhesion to various types of backing materials. There are no restrictions on the viscosity of the siloxane, but a viscosity of from 1 to 500 mPa·s at 25° C. is preferred.

Examples of the silicon-bonded alkoxy groups in the silane having at least one silicon-bonded alkoxy group per molecule include, but are not limited to, methoxy, ethoxy, propoxy, butoxy, and methoxyethoxy, with methoxy being particularly preferred. Examples of silicon-bonded organic groups other than alkoxy in the silane include, but are not limited to, alkyl such as methyl, ethyl, propyl, butyl, pentyl, hexyl, and heptyl; alkenyl such as vinyl, allyl, butenyl, pentenyl, and hexenyl; aryl such as phenyl, tolyl, xylyl, and naphthyl; aralkyl such as benzyl and phenethyl; halogenated alkyl such as chloromethyl, 3-chloropropyl, and 3,3,3-trifluoropropyl; other substituted or unsubstituted monovalent hydrocarbon groups; epoxy-containing monovalent organic groups such as 3-glycidoxypropyl, 4-glycidoxypropyl, and other glycidoxyalkyl groups, 2-(3,4-epoxycyclohexyl)ethyl, 3-(3,4-epoxycyclohexyl)propyl, and other (3,4-epoxycyclohexyl)alkyl groups; and oxysilanylalkyl groups such as 4-oxysilanylbutyl and 8-oxysilanyloctyl. Preferably, the silane contains at least one of epoxy-containing monovalent organic group per molecule because such silanes provide good adhesion to various types of backing materials.

The molecular structure of the siloxane having at least one silicon-bonded alkoxy group per molecule can be linear, linear with some branches, branched, cyclic, or reticulated, with linear, branched, and reticulated being particularly favorable. Examples of the silicon-bonded alkoxy groups in the siloxane include, but are not limited to, methoxy, ethoxy, propoxy, butoxy, and methoxyethoxy, with methoxy being particularly preferred. Examples of silicon-bonded organic groups other than alkoxy in the siloxane include, but are not limited to, alkyl such as methyl, ethyl, propyl, butyl, pentyl, hexyl, heptyl; alkenyl such as vinyl, allyl, butenyl, pentenyl, and hexenyl; aryl such as phenyl, tolyl, xylyl, and naphthyl; aralkyl such as benzyl and phenethyl; halogenated alkyl such as chloromethyl, 3-chloropropyl, and 3,3,3-trifluoropropyl; other substituted or unsubstituted monovalent hydrocarbon groups; epoxy-containing monovalent organic groups such as 3-glycidoxypropyl, 4-glycidoxypropyl, and other such glycidoxyalkyl groups, 2-(3,4-epoxycyclohexyl)ethyl, 3-(3,4-epoxycyclohexyl)propyl, and other such (3,4-epoxycyclohexyl)alkyl groups; and oxysilanylalkyl groups such as 4-oxysilanylbutyl and 8-oxysilanyloctyl. Preferably, the siloxane contains at least one of epoxy-containing monovalent organic groups per molecule because such siloxanes provide good adhesion to various types of backing materials. There are no restrictions on the viscosity of the siloxane, but a viscosity of from 1 to 500 mPa·s at 25° C. is preferred.

The molecular structure of the organosiloxane having at least one silicon-bonded hydroxy group and at least one silicon-bonded alkenyl group per molecule can be linear, linear with some branches, branched, cyclic, and reticulated, with linear, branched, and reticulated being particularly preferred. Examples of silicon-bonded alkenyl groups in the organosiloxane include, but are not limited to, vinyl, allyl, butenyl, pentenyl, hexenyl, and other alkenyl groups, with the vinyl group being particularly preferred. Examples of silicon-bonded organic groups other than alkenyl groups in the organosiloxane include, but are not limited to, alkyl such as methyl, ethyl, propyl, butyl, pentyl, hexyl, and heptyl; aryl such as phenyl, tolyl, xylyl, and naphthyl; aralkyl such as benzyl and phenethyl; halogenated alkyl such as chloromethyl, 3-chloropropyl, and 3,3,3-trifluoropropyl; and other substituted or unsubstituted monovalent hydrocarbon groups. There are no restrictions on the viscosity of component (A), but a viscosity of from 1 to 500 mPa·s at 25° C. is preferred.

There are no particular restrictions on the ratio of the silane or siloxane having at least one silicon-bonded alkoxy group per molecule to the organosiloxane having at least one silicon-bonded hydroxy group and at least one silicon-bonded alkenyl group per molecule, but it is preferable for the weight ratio of the former (silane or siloxane) to the latter (organosiloxane) to be between 1/99 and 99/1 because such a ratio provides particularly good adhesive properties.

The concentration of component (C) should be sufficient to impart good adhesive properties to the cured product of the silicone composition. For example, Component (C) is preferably present in an amount from 0.01 to 20 parts by weight per 100 parts by weight of component (A), and more preferably from 0.1 to 10 parts by weight per 100 parts by weight of component (A). When the amount of component (C) is below this range, the adhesive properties of the cured product tend to diminish. When the amount of component (C) exceeds the above range, there is no change in the adhesive properties of the cured product and the stability of the silicone-based adhesive sheet tends to decrease.

Component (D) of the present invention is a hydrosilylation reaction catalyst that promotes curing of the silicone composition by a hydrosilylation addition reaction. Examples of such catalysts include, but are not limited to, platinum-based catalysts, rhodium-based catalysts, palladium-based catalysts, and other known hydrosilylation reaction catalysts. Platinum-based catalysts are preferred due to their high reactivity. Examples of platinum-based catalysts include, but are not limited to, a platinum micropowder, a platinum-carrying silica micropowder, a platinum-carrying activated carbon, a chloroplatinic acid, an alcohol solution of chloroplatinic acid, an olefin complex of platinum, and an alkenylsiloxane complex of platinum.

The concentration of component (D) should be sufficient to promote the curing of the silicone composition. When a platinum-based catalyst is used, the amount of platinum metal in the catalyst is preferably from 0.01 to 1000 ppm, as weight units, in the silicone composition, and more preferably is from 0.1 to 500 ppm. When the concentration of component (D) is less than 0.01 ppm, the composition will tend to cure extremely slowly. When the concentration of component (D) exceeds 1000 ppm, there is no change in the cure rate of the silicone composition and there will be problems with coloration.

The above-mentioned composition can be obtained by uniformly mixing components (A) to (D), and an incompletely cured or completely cured product can be formed by heating this composition at a temperature from room temperature to 200° C., and preferably from room temperature to 150° C., thereby subjecting it to a hydrosilylation reaction. Care must be taken in the heating of the silicone composition so that the composition does not adhere to the backing material to the degree that it is impossible to separate therefrom.

In the formation of this incompletely cured or completely cured product, it is preferable to add a hydrosilylation reaction inhibitor to the silicone composition in order to enhance the stability of the incompletely cured or completely cured product. Examples of hydrosilylation reaction inhibitors include, but are not limited to, 3-methyl-1-butyn-3-ol, 3,5-dimethyl-1-hexyn-3-ol, phenylbutynol, and other such alkyne alcohols; 3-methyl-3-penten-1-yne, 3,5-dimethyl-3-hexen-1-yne, and other such enyne compounds; 1,3,5,7-tetramethyl-1,3,5,7-tetrahexenyl-cyclotetrasiloxane, and benzotriazole. The concentration of the addition reaction inhibitor will vary with the conditions under which the silicone composition is cured, but a range of 0.00001 to 5 parts by weight per 100 parts by weight of component (A) is preferable for practical purposes.

Other components can also be added to the silicone composition as needed. Examples of such ingredients include precipitated silica, wet silica, fumed silica, calcined silica, titanium oxide, alumina, glass, quartz, aluminosilicic acid, iron oxide, zinc oxide, calcium carbonate, carbon black, silicon carbide, silicon nitride, boron nitride, and other such inorganic fillers, as well as inorganic fillers obtained by treating the above fillers with an organohalosilane, organoalkoxysilane, organosilazane, or other such organosilicon compound; silicone resin, epoxy resin, fluororesin, and other such organic resin micropowders; silver, copper, and other such conductive metal powders, and other fillers; as well as dyes, pigments, flame retardants, and solvents. Furthermore, provided the object of the present invention is not compromised, a curable epoxy resin, curable epoxy-modified silicone resin, curable silicone-modified epoxy resin, curable polyimide resin, curable polyimide-modified silicone resin, curable silicone-modified polyimide resin, or the like can also be added.

The silicone-based adhesive sheet of the present invention is typically characterized by a cured surface having a peak surface area ratio between groups expressed by the formula $CH_x$, where x is 2 or 3, and groups expressed by the formula C—O is 99.999:0.001 to 0.01:99.99 as determined by X-ray photoelectron spectroscopy. Preferably, the ratio is from 99.9:0.1 to 10.0:90.0, more preferably from 99.9:0.1 to 50.0:50.0, and most preferably from 99.0:1.0 to 80.0:20.0. When the peak surface area of the groups expressed by the formula C—O with respect to the peak surface area of the groups expressed by the formula $CH_x$, where x is 2 or 3, is below the above range, the adhesive properties of the obtained silicone-based adhesive sheet tend to diminish. On the other hand, if the above range is exceeded, the stability and mechanical properties of the obtained silicone-based adhesive sheet will tend to diminish. The group expressed by the formula $CH_x$, where x is 2 or 3, may be a part of any organic group, but is generally a methyl group. The group expressed by the formula C—O may be a part of any organic group, but is generally part of an ether group, alcoholic hydroxyl group, epoxy group, alkoxy group, carbonyl group, or ester group. The peak surface area ratio between the groups expressed by the formula $CH_x$, where x is 2 or 3, and groups expressed by the formula C—O is not a function of the peak surface area of other groups.

A method for manufacturing a silicone-based adhesive sheet of the present invention comprises curing a silicone composition between backing materials, wherein at least one of the backing materials has a surface comprising oxygen atoms and/or sulfur atoms in contact with the silicone composition and the backing materials are releasable from the cured product. Preferably the oxygen atoms are present in organic groups selected from the group consisting of carbonyl groups, alkoxy groups, ester groups, and ether groups. It is also preferable for these sulfur atoms to be present in organic groups selected from the group consisting of sulfone groups and thioether groups.

Examples of backing materials having these atoms or groups are the same as the backing materials listed above. Furthermore, it is preferable for these backing materials to have a high dielectric constant and/or refractive index with respect to the cured product of the silicone composition. There are no restrictions on the curable silicone compositions that can be used in the present manufacturing method, but examples are the silicone compositions described above.

Examples of methods for manufacturing a silicone-based adhesive sheet with this manufacturing method include a method in which a curable silicone composition is cured while sandwiched between the above-mentioned backing materials, a method in which both sides of a support such as a silicone rubber sheet or an organic resin sheet are evenly coated with this composition and the coatings are then cured while sandwiched between the above-mentioned backing materials, and a method in which a composition containing silicone rubber particles, organic resin particles, inorganic particles, or another such filler is cured while sandwiched between the above-mentioned backing materials. To prepare a silicone-based adhesive sheet sandwiched between these backing materials, it is preferable to cure the silicone composition after it has been molded or while it is being molded with a double roller, a press, or the like.

This semiconductor device of the present invention comprises a semiconductor chip bonded to a chip attachment component by means of a silicone-based adhesive sheet, wherein at least the side of the adhesive sheet in contact with a semiconductor chip or the chip attachment component is formed from a curable silicone composition that has been semi-cured or completely cured. The silicone-based adhesive sheet used in this semiconductor device is as described above, and the preferred methods for manufacturing this sheet are also as described above. Examples of a semiconductor device include diodes, transistors, thyristors, monolithic ICs, hybrid ICs, LSI circuits, and VLSI circuits. All or part of one side of a semiconductor chip, such as a semiconductor chip in a hybrid IC, or a diode, transistor, thyristor, monolithic IC, or other such memory can be bonded to a chip attachment component by the silicone-based adhesive sheet.

Figure 2:
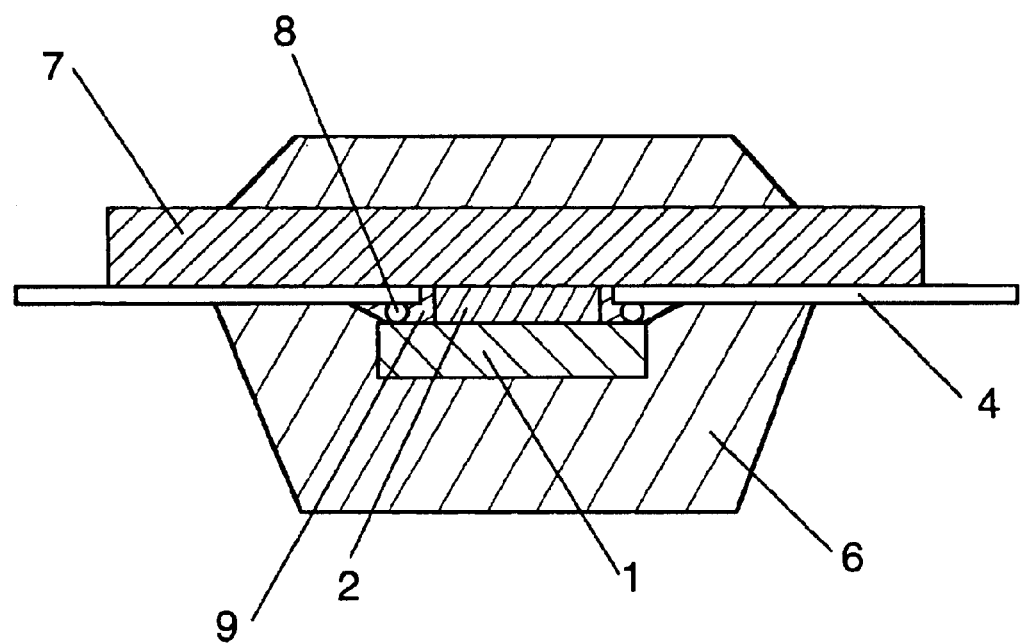
FIG. 2 is a cross section of an LSI chip, which is also an example of the semiconductor device of the present invention.

To describe this semiconductor device in further detail, FIG. 1 is a cross section of a hybrid IC and FIG. 2 is a cross section of an LSI chip, which are examples of the semiconductor device of the present invention. The semiconductor device illustrated in FIG. 1 has a semiconductor chip 1 bonded to a circuit board 3 by a silicone-based adhesive sheet 2, and this semiconductor chip 1 is electrically connected by a bonding wire 5 to circuit wiring 4 connected to an external lead. This circuit board 3 is formed from a ceramic, glass, epoxy resin, polyimide resin, phenol resin, bakelite resin, melamine resin, glass fiber-reinforced epoxy resin, or the like. The circuit wiring 4 is formed from gold, copper, aluminum, silver-palladium, indium tin oxide (ITO), or the like. This bonding wire 5 is formed from gold, copper, or aluminum. The semiconductor element 1 is sealed by a sealing resin 6. Examples of the resin that forms this sealing resin 6 include epoxy resins, phenol resins, and polyphenylene sulfide resins. In addition to this semiconductor chip 1, electronic parts such as resistors, capacitors, coils, and so on may also be mounted on this circuit board 3.

Meanwhile, the semiconductor device illustrated in FIG. 2 has the semiconductor chip 1 bonded to a circuit board 7 by a cured silicone-based adhesive sheet 2, and this semiconductor chip 1 is electrically connected by a bump 8 to the circuit wiring 4 on the circuit board 7. This circuit board 7 is formed from a polyimide resin, ceramic, glass fiber-reinforced epoxy resin, or the like. This bump 8 is formed from gold, aluminum, solder, or the like. The area around the bump 8 between the semiconductor chip 1 and the circuit board 7 is impregnated with a resin 9. Examples of the resin that forms this resin 9 include a liquid curable silicone resin and a liquid curable epoxy resin. If needed, this semiconductor chip 1 is further sealed by the sealing resin 6.

The method for manufacturing this semiconductor device will be described through reference to the figures. The following is an example of a method for manufacturing the semiconductor device illustrated in FIG. 1. Either a silicone-based adhesive sheet is stuck to the semiconductor chip 1 and the circuit board 3 is then stuck to this sheet, or a silicone-based adhesive sheet is stuck over this circuit board 3 and this semiconductor chip 1 is then stuck to this sheet, and this sheet is then bonded. A preferred method for bonding this sheet is to leave it at room temperature, or to heat it to 200° C. or below. It is preferable for the sheet to be bonded under pressure. After this, the semiconductor chip 1 is electrically connected to the circuit wiring 4 by the bonding wire 5. This semiconductor chip 1 is then sealed as needed with the sealing resin 6.

The following is an example of a method for manufacturing the semiconductor device illustrated in FIG. 2. Either a silicone-based adhesive sheet is stuck to the semiconductor chip 1 and the circuit board 7 is then stuck to this sheet, or a silicone-based adhesive sheet is stuck to this circuit board 7 and this semiconductor chip 1 is then stuck to this sheet, and this sheet is then bonded. A preferred method for bonding this sheet is to leave it at room temperature, or to heat it to 200° C. or below. It is preferable for the sheet to be bonded under pressure. After this, the semiconductor chip 1 is electrically connected to the circuit wiring 4 by the bump 8. The area around this bump 8 is then impregnated with the resin 9. This semiconductor chip 1 is then sealed as needed with the scaling resin 6.

The silicone-based adhesive sheet of the present invention is easier to handle and provides superior adhesion. The present method of manufacturing a silicone-based adhesive sheet is more efficient and the semiconductor device of the present invention has superior reliability.

EXAMPLES

The silicone-based adhesive sheet, the manufacturing method therefor, and the semiconductor device of the present invention will be described through working examples. The viscosity of a silicone composition was measured at 25° C. The refractive index of a backing material and a silicone adhesive sheet were measured at 25° C. and at a wavelength of 589 nm. The adhesive properties of the silicone-based adhesive sheet, the peak surface area ratio between groups expressed by the formula $CH_x$, where x is 2 or 3, and groups expressed by the formula C—O on the surface of the silicone-based adhesive sheet, and the reliability of the semiconductor device were evaluated as follows.

Adhesive Properties of Silicone-Based Adhesive Sheet

A silicone-based adhesive sheet (1×1 cm) was adhered to a silicon wafer (3×3 cm) and to a polyimide resin film (3×3 cm), after which this product was heated for 2 hours in a hot air circulating oven at 150° C., which produced a test piece in which this sheet was bonded to a backing material. The adhesion to the backing material was evaluated by using a stainless steel spatula to scrape off just the sheet from the test piece. An evaluation of ○ was given when the sheet adhered well to the backing material, a Δ when there was some separation from the backing material, and an x when the sheet completely separated from the backing material.

Measurement of the Peak Surface Area Ratio Between Groups Expressed by the Formula $CH_x$ (x=2 or 3) and Groups Expressed by the Formula C—O The surface of the silicone-based adhesive sheet was examined by X-ray photoelectron spectroscopy (ESCA) to measure the detection intensity of groups expressed by the formula $CH_x$, where x=2 or 3, and groups expressed by the formula C—O in the carbon (C) Is peak, and the ratio thereof was calculated. The ESCA measurement conditions are as follows:

Excitation X-rays: monochromatic AlKα1, doublet (1486.6 eV)

X-ray diameter: 1 mm

X-ray output: 10 kV, 15 mA

Photoelectron release angle: 90 degrees

Data processing: Bonding energy of C1s main peak set at 284.0 eV

Evaluation of Semiconductor Device Reliability
(Part 1)

The reliability of the semiconductor device shown in FIG. 1 was evaluated. Specifically, a silicone-based adhesive sheet was adhered to a circuit board 3 made of a glass fiber-reinforced resin and having circuit wiring 4 formed by printing on its surface and having external leads at its terminals, and a semiconductor chip 1 was stuck onto this sheet. Then, immediately after the semiconductor chip 1 was stuck to the circuit board 3 via the silicone-based adhesive sheet, this product was heated for 2 hours in a hot air circulating oven at 150° C. Next, the circuit wiring 4 and the semiconductor chip 1 of this semiconductor device were electrically connected by a bonding wire 5. After this, the semiconductor device was sealed with an epoxy sealing resin 6. Twenty of these semiconductor devices were produced. The semiconductor devices produced in this manner were left for 1000 and 3000 hours at a temperature of 85° C. and a relative humidity of 85%, after which an electrical conductivity test was conducted between the external leads, and the number of semiconductor devices with defective conduction (defect rate) was determined.

Evaluation of Semiconductor Device Reliability
(Part 2)

The reliability of the semiconductor device shown in FIG. 2 was evaluated. Specifically, a silicone-based adhesive sheet was stuck onto a circuit board 7 made of a polyimide resin, and a semiconductor element 1 was stuck onto this sheet, after which the circuit wiring 4 on the circuit board 7 was electrically connected by bumps 8 made of gold. Then, immediately after the semiconductor chip 1 was stuck to the circuit board 7 via the silicone-based adhesive sheet, this product was heated for 2 hours in a hot air circulating oven at 150° C. Next, the area around the bumps 8 between the semiconductor chip 1 and the circuit board 7 of the semiconductor device was impregnated with a silicone resin 9, after which the semiconductor element 1 was sealed with an epoxy sealing resin. Twenty of these semiconductor devices were produced. The semiconductor devices produced in this manner were left for 1000 and 3000 hours at a temperature of 85° C. and a relative humidity of 85%, after which an electrical conductivity test was conducted between the external leads, and the number of semiconductor devices with defective conduction (defect rate) was determined.

Example 1

A hydrosilylation reaction type of crosslinkable silicone composition with a viscosity of 25,000 mPa·s was prepared by uniformly mixing 72 weight parts of a dimethylvinylsiloxy group-capped dimethylpolysiloxane (vinyl group content=0.08 wt %) that was capped at both ends of the molecular chain and had a viscosity of 40,000 mPa·s and 15 weight parts of a dimethylvinylsiloxy group-capped dimethylsiloxane-methylvinylsiloxane copolymer (vinyl group content=0.84 wt %) that was capped at both ends of the molecular chain and had a viscosity of 6000 mPa·s as component A, 3 weight parts of a trimethylsiloxy group-capped dimethylsiloxane-methylhydrogensiloxane copolymer (silicon atom-bonded hydrogen atom content 0.7 wt %) that was capped at both ends of the molecular chain and had a viscosity of 5 mPa·s as component B, 1.0 weight part of a mixture of 3-glycidoxypropyltrimethoxy-silane and a dimethylhydroxy group-capped methylvinylsiloxane oligomer (vinyl group content=31 wt %) that was capped at both ends of the molecular chain and had a viscosity of 40 mPa·s in a 1:1 weight ratio as component C, a 1,3-divinyl-1, 1,3,3-tetramethyldisiloxane complex of platinum (in an amount such that there was 5 ppm platinum metal, as weight units, in the composition) as component D, and 0.01 weight part of 3-phenyl-1-butyn-3-ol as an addition reaction inhibitor.

This crosslinkable silicone composition was sandwiched between polyester resin sheets (dielectric constant=3.2, refractive index=1.66) used as non-stick backing materials having oxygen atoms (the oxygen atoms in the carbonyl groups) chemically bonded to the surface and having a thickness of 100 μm. The thickness of the composition was reduced to 200 μm by a stainless steel double roller adjusted for clearance. This product was heated for 10 minutes in a hot air circulating oven at 80° C. thereby curing the composition and preparing a silicone-based adhesive sheet in an incompletely cured state (dielectric constant=2.8, refractive index=1.41). This silicone-based adhesive sheet was easy to peel away from the polyester resin sheets, and had an even thickness of about 200 μm. The adhesive properties of the silicone-based adhesive sheet and the reliability of a semiconductor device produced using the sheet, were evaluated using the methods described above. The results are presented in Table 1.

Example 2

The silicone composition described in Example 1 was sandwiched between polyester resin sheets having a thickness of 100 μm. The thickness of this composition was reduced to 200 μm by a stainless steel double roller adjusted for clearance. This product was heated for 30 minutes in a hot air circulating oven at 80° C., thereby preparing a silicone-based adhesive sheet composed of a cured product of the silicone composition. This silicone-based adhesive sheet was easy to peel away from the polyester resin sheets, and had an even thickness of about 200 μm. The peak surface area ratio between groups expressed by the formula $CH_x$, where x is 2 or 3, and groups expressed by the formula C—O on the sides of this silicone-based adhesive sheet in contact with the polyester resin sheets and the adhesive properties of the silicone-based adhesive sheet were evaluated using the methods described above. The results are presented in Table 1.

Example 3

Other than using a polypropylene resin sheet whose surface had undergone a corona treatment, which had a thickness of 100 μm, and which had oxygen atoms chemically bonded to the surface as a non-stick backing material instead of the polyester resin sheet used in Example 1, a silicone-based adhesive sheet (dielectric constant=2.8, refractive index=1.41) was prepared in the same manner as in Example 1. This silicone-based adhesive sheet was easy to peel away from the polypropylene resin sheets, and had an even thickness of about 200 μm. The adhesive properties of this silicone-based adhesive sheet, the reliability of a semiconductor device produced using this sheet, and the peak surface area ratio between groups having the formula $CH_x$, where x=2 or 3, and groups having the formula C—O on the sides of the silicone-based adhesive sheet in contact with the polypropylene resin were evaluated by the methods given above, the results of which are presented in Table 1.

Example 4

Other than using a polyester sulfone resin sheet (dielectric constant=3.5, refractive index=1.65) which had a thickness of 100 μm and which had sulfur atoms (the sulfur atoms in the sulfone groups) chemically bonded to the surface as a non-stick backing material instead of the polyester resin sheet used in Example 1, and heating for 300 minutes in a hot air circulating oven at 80° C., a silicone-based adhesive sheet (dielectric constant=2.8, refractive index=1.41) in which the silicone composition had been cured more or less sufficiently was prepared in the same manner as in Example 1. This silicone-based adhesive sheet was easy to peel away from the polyester sulfone resin sheets, and had an even thickness of about 200 μm. The adhesive properties of this silicone-based adhesive sheet, and the reliability of a semiconductor device produced using this sheet, were evaluated by the methods given above, the results of which are presented in Table 1.

Example 5

A hydrosilylation reaction type of crosslinkable silicone composition with a viscosity of 25,000 mPa·s was prepared by uniformly mixing 72 weight parts of a dimethylvinylsiloxy group-capped dimethylsiloxane-methylphenylsiloxane copolymer (vinyl group content=0.08 wt %, phenyl group content with respect to the total silicon atom-bonded organic groups=5 mol %) that was capped at both ends of the molecular chain and had a viscosity of 40,000 mPa·s and 15 weight parts of a methylphenylvinylsiloxy group-capped dimethylsiloxane-methylvinylsiloxane methylphenylsiloxane copolymer (vinyl group content=0.84 wt %, phenyl group content with respect to the total silicon atom-bonded organic groups=5 mol %) that was capped at both ends of the molecular chain and had a viscosity of 6000 mPa·s as component A, 3 weight parts of a trimethylsiloxy group-capped dimethylsiloxane-methylhydrogensiloxane copolymer (silicon atom-bonded hydrogen atom content=0.7 wt %) that was capped at both ends of the molecular chain and had a viscosity of 5 mPa·s as component B, 2.0 weight parts of a mixture of 3-glycidoxypropyltrimethoxy-silane and a dimethylhydroxy group-capped methylvinylsiloxane oligomer (vinyl group content=31 wt %) that was capped at both ends of the molecular chain and had a viscosity of 40 mPa·s in a 1:1 weight ratio as component C, a 1,3-divinyl-1,1,3,3-tetramethyldisiloxane complex of platinum (in an amount such that there was 5 ppm platinum metal, as weight units, in the composition) as component D, and 0.01 weight part of 3-phenyl-l-butyn-3-ol as an addition reaction inhibitor.

This crosslinkable silicone composition was sandwiched between polyphenylene sulfide resin sheets (dielectric constant=3.0, refractive index=1.83) used as non-stick backing materials having sulfur atoms (the sulfur atoms in the thioether groups) chemically bonded to the surface and having a thickness of 100 μm. The thickness of the composition was reduced to 200 μm by a stainless steel double roller adjusted for clearance. This product was heated for 30 minutes in a hot air circulating oven at 80° C., thereby curing the composition and preparing a silicone-based adhesive sheet in a incompletely-cured state (dielectric constant=3.0). This silicone-based adhesive sheet was easy to peel away from the polyphenylene sulfide resin sheets, and had an even thickness of about 200 μm. The adhesive properties of this silicone-based adhesive sheet, and the reliability of a semiconductor device produced using this sheet, were evaluated by the methods given above, the results of which are presented in Table 1.

Comparative Example 1

Other than using a polypropylene resin sheet whose surface had not undergone a corona treatment, which had a thickness of 100 μm, and which had no oxygen atoms or sulfur atoms chemically bonded to the surface as a non-stick backing material instead of the polypropylene resin sheet whose surface had undergone a corona treatment used in Example 3, a silicone-based adhesive sheet (dielectric constant=2.8, refractive index=1.41) was prepared in the same manner as in Example 3. This silicone-based adhesive sheet was easy to peel away from the polypropylene resin sheets, and had an even thickness of about 200 μm. The adhesive properties of this silicone-based adhesive sheet, and the reliability of a semiconductor device produced using this sheet, were evaluated by the methods given above, the results of which are presented in Table 1.

Comparative Example 2

Other than using a polytetrafluoroethylene (PTFE) resin sheet (dielectric constant=2.1, refractive index=1.34) which had no oxygen atoms or sulfur atoms chemically bonded to the surface as a non-stick backing material instead of the polyester sulfone resin sheet used in Example 4, a silicone-based adhesive sheet (dielectric constant=2.8, refractive index=1.41) in which the silicone composition had been cured sufficiently was prepared in the same manner as in Example 4. This silicone-based adhesive sheet was easy to peel away from the polypropylene resin sheets, and had an even thickness of about 200 μm. The adhesive properties of this silicone-based adhesive sheet, and the reliability of a semiconductor device produced using this sheet, were evaluated by the methods given above, the results of which are presented in Table 1.

Comparative Example 3

The silicone composition of Example 1 was spread out in a thickness of about 200 μm over the polyester resin sheet used in Example 1, and this product was heated for 30 minutes in a hot air circulating oven at 80° C. with one side thus left exposed, thereby preparing a silicone-based adhesive sheet composed of this composition cured in the form of a sheet. One side of this silicone-based adhesive sheet was easy to peel away from the polyester resin sheet, and the silicone-based adhesive sheet had an even thickness of about 200 μm. The peak surface area ratio between groups expressed by the formula $CH_x$, where x is 2 or 3, and groups expressed by the formula C—O on the exposed side of this silicone-based adhesive sheet was evaluated by the method given above, and the adhesive properties of these sides were also evaluated, the results of which are presented in Table 1.

TABLE 1

|  | Ex. 1 | Ex. 2 | Ex. 3 | Ex. 4 | Ex. 5 | Comp. Ex. 1 | Comp. Ex. 2 | Comp. Ex. 3 |
|---|---|---|---|---|---|---|---|---|
| Adhesive properties |  |  |  |  |  |  |  |  |
| Silicon wafer | ○ | ○ | ○ | ○ | ○ | ○ | x | x |
| Polyimide resin | ○ | ○ | ○ | ○ | ○ | ○ | x | x |
| Reliability of semi-conductor device (Part 1) Defect rate (%) |  |  |  |  |  |  |  |  |
| After 1000 hours | ○ | — | ○ | ○ | ○ | ○ | — | — |
| After 3000 hours | ○ | — | ○ | ○ | ○ | 15 | — | — |
| Reliability of semi-conductor device (Part 2) Defect rate (%) |  |  |  |  |  |  |  |  |
| After 1000 hours | ○ | — | ○ | ○ | ○ | ○ | — | — |
| After 3000 hours | ○ | — | 5 | ○ | ○ | 20 | — | — |
| $CH_x$:C—O peak surface area ratio | — | 89.0:11.0 | 93.0:7.0 | — | — | — | — | 100.0:0.0 |

That which is claimed is:

1. A method of manufacturing a silicone-based adhesive sheet comprising:
   (i) curing a silicone composition to form a substantially cured product while the composition lies between backing materials, wherein at least one of the backing materials has a surface comprising oxygen atoms in contact with the silicone composition and the backing materials are releasable from the cured product, and
   (ii) separating the cured product from the backing materials.

2. The method of claim 1, wherein the method further introducing oxygen atoms or groups in which oxygen atoms are constituent atoms to a surface of at least one backing material prior to step (i).

3. The method of claim 1, wherein the sheet has a thickness of from 1 to 1000 µm.

4. The method of claim 1, wherein the oxygen atoms are contained in an organic group selected from the group consisting of carbonyl, alkoxy, ester, and ether.

5. The method of claim 1, wherein the silicone composition is a hydrosilylation curable silicone composition.

6. The method of claim 5, wherein the hydrosilylation curable silicone composition comprises:
   (A) an organopolysiloxane having an average of at least two silicon-bonded alkenyl groups per molecule;
   (B) an organopolysiloxane having an average of at least two silicon-bonded hydrogen atoms per molecule in an amount sufficient to crosslink component (A);
   (C) at least one type of adhesion promoter selected from the group consisting of (i) at least one siloxane having at least one silicon-bonded alkoxy group and at least one silicon-bonded alkenyl group per molecule, (ii) at least one siloxane having at least one silicon-bonded alkoxy group and at least one silicon-bonded hydrogen atom per molecule, (iii) at least one siloxane having at least one silicon-bonded alkoxy group, at least one silicon-bonded alkenyl group, and at least one silicon-bonded epoxy-containing monovalent organic group per molecule, (iv) a mixture comprising at least one silane having at least one silicon-bonded alkoxy group per molecule and at least one organosiloxane containing at least one silicon-bonded alkenyl group and at least one silicon-bonded hydroxy group per molecule, (v) a reaction mixture of (iv), (vi) a mixture comprising at least one siloxane having at least one silicon-bonded alkoxy group per molecule and at least one organosiloxane having at least one silicon-bonded alkenyl group and at least one silicon-bonded hydroxy group per molecule, (vii) a reaction mixture of (vi), (viii) a mixture comprising at least one silane having at least one silicon-bonded alkoxy group and at least one silicon-bonded epoxy-containing monovalent organic group per molecule and at least one organosiloxane having at least one silicon-bonded alkenyl group and at least one silicon-bonded hydroxy group per molecule, (ix) a reaction mixture of (viii), (x) a mixture comprising at least one siloxane having at least one silicon-bonded alkoxy group and at least one silicon-bonded epoxy-containing monovalent organic group per molecule and at least one organosiloxane having at least one silicon-bonded alkenyl group and at least one silicon-bonded hydroxy group per molecule, and (xi) a reaction mixture of (x); and
   (D) a hydrosilylation catalyst.

7. A method of manufacturing a silicone-based adhesive sheet comprising:
   (i) curing a silicone composition to form a cured product while the composition lies between backing materials, wherein at least one of the backing materials has a surface comprising sulfur atoms in contact with the silicone composition and the backing materials are releasable from the cured product, and
   (ii) separating the cured product from the backing materials.

8. The method of claim 7, wherein the cured product is an incompletely cured product of the silicone composition.

9. The method of claim 7, wherein the cured product is a substantially cured product of the silicone composition.

10. The method of claim 7, wherein the sheet has a thickness of from 1 to 1000 µm.

11. The method of claim 7, wherein the sulfur atoms are contained in an organic group selected from the group consisting of sulfone groups and thioether groups.

12. The method of claim 7, wherein the surface of the backing material in contact with the silicone composition further comprises oxygen atoms.

13. The method of claim 12, wherein the oxygen atoms are contained in an organic group selected from the group consisting of carbonyl, alkoxy, ester, and ether.

14. The method of claim 7, wherein the silicone composition is a hydrosilylation curable silicone composition.

15. The method of claim 14, wherein the hydrosilylation curable silicone composition comprises:

(A) an organopolysiloxane having an average of at least two silicon-bonded alkenyl groups per molecule;

(B) an organopolysiloxane having an average of at least two silicon-bonded hydrogen atoms per molecule in an amount sufficient to crosslink component (A);

(C) at least one type of adhesion promoter selected from the group consisting of (i) at least one siloxane having at least one silicon-bonded alkoxy group and at least one silicon-bonded alkenyl group per molecule, (ii) at least one siloxane having at least one silicon-bonded alkoxy group and at least one silicon-bonded hydrogen atom per molecule, (iii) at least one siloxane having at least one silicon-bonded alkoxy group, at least one silicon-bonded alkenyl group, and at least one silicon-bonded epoxy-containing monovalent organic group per molecule, (iv) a mixture comprising at least one silane having at least one silicon-bonded alkoxy group per molecule and at least one organosiloxane containing at least one silicon-bonded alkenyl group and at least one silicon-bonded hydroxy group per molecule, (v) a reaction mixture of (iv), (vi) a mixture comprising at least one siloxane having at least one silicon-bonded alkoxy group per molecule and at least one organosiloxane having at least one silicon-bonded alkenyl group and at least one silicon-bonded hydroxy group per molecule, (vii) a reaction mixture of (vi), (viii) a mixture comprising at least one silane having at least one silicon-bonded alkoxy group and at least one silicon-bonded epoxy-containing monovalent organic group per molecule and at least one organosiloxane having at least one silicon-bonded alkenyl group and at least one silicon-bonded hydroxy group per molecule, (ix) a reaction mixture of (viii), (x) a mixture comprising at least one siloxane having at least one silicon-bonded alkoxy group and at least one silicon-bonded epoxy-containing monovalent organic group per molecule and at least one organosiloxane having at least one silicon-bonded alkenyl group and at least one silicon-bonded hydroxy group per molecule, and (xi) a reaction mixture of (x); and (D) a hydrosilylation catalyst.

16. A composition comprising a substantially cured silicone-based adhesive sheet positioned between backing materials, wherein at least one of the backing materials has a surface comprising oxygen atoms in contact with the silicone composition and the backing materials are releasable from the cured product.

17. A composition comprising a cured silicone-based adhesive sheet positioned between backing materials, wherein at least one of the backing materials has a surface comprising sulfur atoms in contact with the silicone composition and the backing materials are releasable from the cured product.

* * * * *

(12) EX PARTE REEXAMINATION CERTIFICATE (10543rd)
United States Patent
Yamakawa et al.

(10) Number: US 6,761,947 C1
(45) Certificate Issued: *Mar. 17, 2015

(54) SILICONE-BASED ADHESIVE SHEET, METHOD FOR MANUFACTURING SAME, AND SEMICONDUCTOR DEVICE

(75) Inventors: Kimio Yamakawa, Chiba Prefecture (JP); Minoru Isshiki, Chiba Prefecture (JP); Yoshiko Otani, Chiba Prefecture (JP); Katsutoshi Mine, Chiba Prefecture (JP)

(73) Assignee: Dow Corning Toray Silicone Company, Ltd., Marunouchi, Chiyoda-Ku, Tokyo (JP)

Reexamination Request:
No. 90/013,337, Sep. 5, 2014

Reexamination Certificate for:
Patent No.: 6,761,947
Issued: Jul. 13, 2004
Appl. No.: 10/347,564
Filed: Jan. 17, 2003

(*) Notice: This patent is subject to a terminal disclaimer.

Related U.S. Application Data

(62) Division of application No. 09/384,152, filed on Aug. 27, 1999, now Pat. No. 6,551,676.

(30) Foreign Application Priority Data

Sep. 4, 1998 (JP) .................................... 10-250593
Sep. 25, 1998 (JP) .................................... 10-270754

(51) Int. Cl.
*C09J 7/00* (2006.01)
*C09J 183/04* (2006.01)
*H01L 21/58* (2006.01)
*H01L 21/02* (2006.01)
*C09J 183/00* (2006.01)
*H01L 23/00* (2006.01)
*H01L 23/495* (2006.01)

(52) U.S. Cl.
CPC *C09J 7/00* (2013.01); *C09J 183/04* (2013.01); *H01L 24/32* (2013.01); *H01L 24/29* (2013.01); *H01L 24/83* (2013.01); *H01L 23/49513* (2013.01); *H01L 2924/01045* (2013.01); *Y10S 428/914* (2013.01)
USPC ....... 428/40.1; 156/275.5; 156/327; 156/329; 428/41.3; 428/41.4; 428/41.5; 428/41.7; 428/41.8; 428/447; 428/448; 428/480; 428/914; 257/E21.505

(58) Field of Classification Search
None
See application file for complete search history.

(56) References Cited

To view the complete listing of prior art documents cited during the proceeding for Reexamination Control Number 90/013,337, please refer to the USPTO's public Patent Application Information Retrieval (PAIR) system under the Display References tab.

*Primary Examiner* — Alan Diamond

(57) ABSTRACT

A silicone-based adhesive sheet prepared by a process comprising (i) curing a silicone composition to form a substantially cured product while the composition lies between backing materials, wherein at least one of the backing materials has a surface comprising oxygen atoms and/or sulfur atoms in contact with the silicone composition and the backing materials are releasable from the cured product, and (ii) separating the cured product from the backing materials. A method of manufacturing a silicone-based adhesive sheet comprising (i) curing a silicone composition to form a cured product while the composition lies between backing materials, wherein at least one of the backing materials has a surface comprising oxygen atoms and/or sulfur atoms in contact with the silicone composition and the backing materials are releasable from the cured product, and (ii) separating the cured product from the backing materials. A semiconductor device comprising a semiconductor chip, a chip attachment component, and the above-mentioned silicone-based adhesive sheet, wherein the semiconductor chip is bonded to the chip attachment component with the silicone-based adhesive sheet.

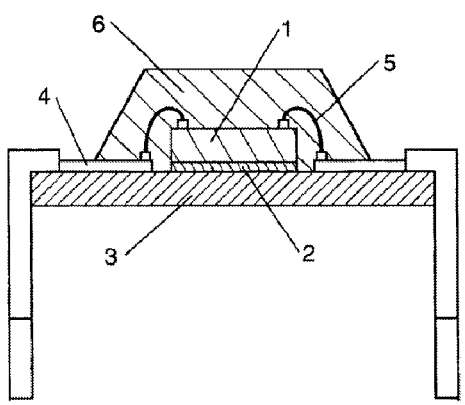

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-6 and 16 are cancelled.

Claims 7-15 and 17 were not reexamined.

\* \* \* \* \*